(12) United States Patent
Tan et al.

(10) Patent No.: US 8,324,031 B2
(45) Date of Patent: Dec. 4, 2012

(54) DIFFUSION BARRIER AND METHOD OF FORMATION THEREOF

(75) Inventors: Shyue Seng Tan, Singapore (SG); Lee Wee Teo, Singapore (SG); Yung Fu Chong, Singapore (SG); Elgin Quek, Singapore (SG); Sanford Chu, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 444 days.

(21) Appl. No.: 12/144,652

(22) Filed: Jun. 24, 2008

(65) Prior Publication Data

US 2009/0315152 A1 Dec. 24, 2009

(51) Int. Cl.
*H01L 21/00* (2006.01)

(52) U.S. Cl. .............. 438/152; 257/E31.009; 257/376

(58) Field of Classification Search .......... 438/152; 257/376, E31.009
See application file for complete search history.

(56) References Cited

U.S. PATENT DOCUMENTS

| | | | |
|---|---|---|---|
| 5,508,211 A | 4/1996 | Yee et al. | |
| 5,589,407 A | 12/1996 | Meyyappan et al. | |
| 5,707,896 A | 1/1998 | Chiang et al. | |
| 5,723,896 A * | 3/1998 | Yee et al. | 257/499 |
| 6,124,620 A | 9/2000 | Gardner et al. | |
| 6,365,488 B1 | 4/2002 | Liao | |
| 6,531,776 B2 | 3/2003 | Lin et al. | |
| 6,696,352 B1 | 2/2004 | Carr et al. | |
| 7,001,807 B1 | 2/2006 | Zheng et al. | |
| 2003/0022489 A1* | 1/2003 | Kido et al. | 438/659 |
| 2005/0003605 A1* | 1/2005 | Dokumaci et al. | 438/231 |
| 2006/0166472 A1 | 7/2006 | Henley et al. | |
| 2006/0286730 A1* | 12/2006 | Liu et al. | 438/197 |
| 2007/0128742 A1 | 6/2007 | Lee et al. | |
| 2010/0127262 A1* | 5/2010 | Giles | 257/57 |

FOREIGN PATENT DOCUMENTS

| | | |
|---|---|---|
| EP | 1791175 | 5/2007 |
| TW | 383507 | 3/2000 |
| WO | 95/06956 | 3/1995 |
| WO | 2004/010481 | 1/2004 |
| WO | 2007/012290 | 2/2007 |

\* cited by examiner

*Primary Examiner* — Thao Le
*Assistant Examiner* — Matthew Gordon
(74) *Attorney, Agent, or Firm* — Horizon IP Pte Ltd

(57) ABSTRACT

A method of forming a device is presented. The method includes providing a structure having first and second regions. A diffusion barrier is formed between at least a portion of the first and second regions. The diffusion barrier comprises cavities that reduce diffusion of elements between the first and second regions.

7 Claims, 16 Drawing Sheets

DIFFUSION BARRIER AND METHOD OF FORMATION THEREOF

FIELD OF THE INVENTION

The present invention relates to diffusion barriers and to a method of forming a diffusion barrier. In particular but not exclusively the invention relates to a diffusion barrier in an integrated circuit device and a method of forming a diffusion barrier in an integrated circuit device.

BACKGROUND

Diffusion of dopant atoms and other atoms in integrated circuit (IC) structures is responsible for a number of problems associated with the fabrication and long term stability of IC structures. For example, electrical characteristics of static random access memory (SRAM) structures are adversely affected by lateral diffusion in polysilicon of dopant such as phosphorus from strongly n+ doped regions. This causes N+/P+ junctions between NFET and PFET devices to shift towards the PFET device.

In order to ameliorate the problem, a shallower n+ pre-doped implant and a smaller N+ implanted area have been adopted. However, substantial diffusion of dopant still occurs during subsequent thermal processing such as polysilicon reoxidation processes and rapid thermal annealing (RTA).

Furthermore, diffusion of extrinsic dopant and source/drain dopant into the channel region can occur, again resulting in an adverse effect on electrical characteristics of the structure. For example, the threshold voltage at which a channel region of a transistor device begins to conduct typically reduces with increased amounts of lateral diffusion of extrinsic and source/drain dopant. Consequently, sub-threshold leakage can be increased by several orders of magnitude.

To mitigate this problem, a reduced dose of dopant may be applied when forming a halo region, and a lower temperature employed in the course of rapid thermal annealing of the structure. However, such measures may introduce further problems such as gate induced drain leakage (GIDL) and a lack of dopant activation.

SUMMARY

A method of forming a device or a semiconductor device is disclosed. The method includes providing a structure or substrate having first and second regions. The method further includes forming a diffusion barrier between at least a portion of the first and second regions. The diffusion barrier comprises cavities that reduce diffusion of elements between the first and second regions.

In another aspect, a device that comprises a structure having first and second regions is presented. The device further includes a diffusion barrier disposed between at least a portion of the first and second regions. The diffusion barrier comprises cavities that reduce diffusion of elements between the first and second regions.

These and other objects along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Various embodiments of the present invention are described with reference to the following drawings, in which.

DETAILED DESCRIPTION

Figure 1:
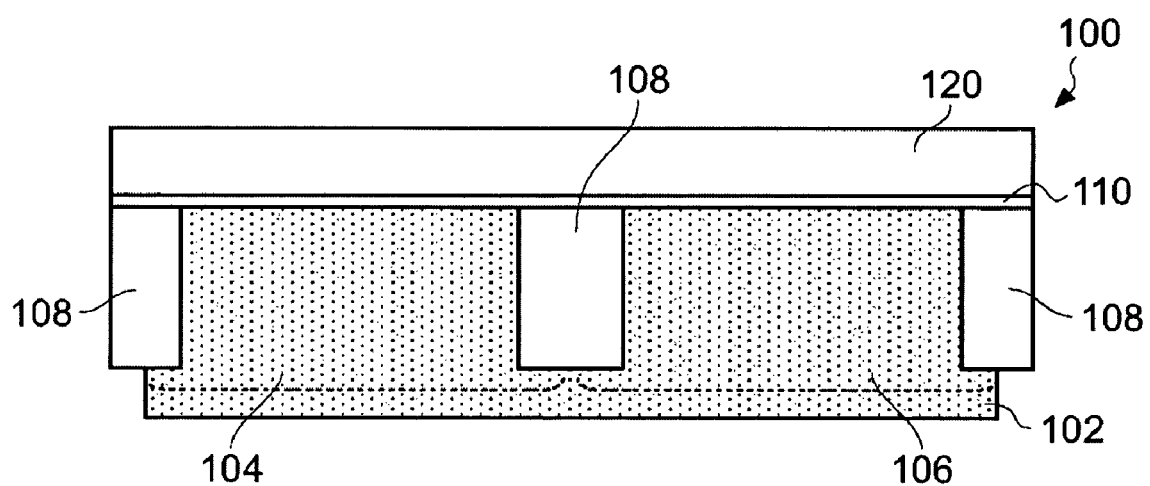
FIGS. 1 to 4 show structures formed during a process of forming a diffusion barrier in a polysilicon layer according to an embodiment of the invention.

FIG. 1 is a schematic illustration in cross-section of a structure 100 formed during a process of fabricating a semiconductor device, such as a static random access memory (SRAM) device. Forming other types of devices or structures are also useful.

The structure has a silicon substrate 102 having a plurality of, for example, P-type doped well regions (P-wells) 104 and a plurality of N-type doped well regions (N-wells) 106. Respective P-wells 104 and N-wells 106 are separated by shallow trench isolation (STI) regions 108.

The substrate 102 has a layer of a gate dielectric medium 110 formed thereover. In the embodiment of FIG. 1, the layer of gate dielectric medium 110 is a layer of nitrided silicon oxide. In some embodiments, the layer of gate dielectric medium 110 is silicon oxide or any other suitable gate dielectric medium. In some embodiments, layer 110 is formed from a high dielectric constant ("high-k") gate dielectric material.

The layer of gate dielectric medium 110 has a gate electrode layer 120 formed thereover. The gate electrode layer, for example, comprises polysilicon. In the embodiment of FIG. 1, the polysilicon layer 120 is around 800 Å in thickness. Other thicknesses are also useful. In some embodiments, the thickness is in the range from around 600 Å to around 2000 Å.

Other substrate materials are also useful. Other thicknesses of polysilicon layer 120 are also useful. Other layer materials are also useful for forming a gate electrode instead of or in addition to polysilicon.

Figure 2:
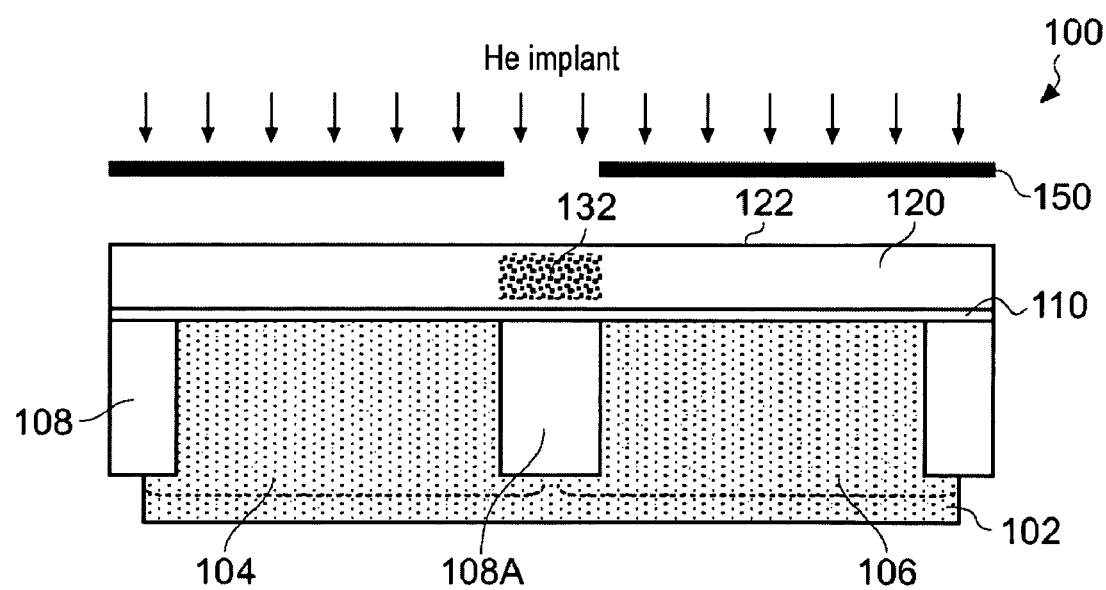

FIG. 2 shows the structure of FIG. 1 during a process of implanting an implant medium into the polysilicon layer 120 to form an implant region 132. In one embodiment, the implant region 132 spans or substantially spans the thickness of the polysilicon layer 120.

In some embodiments, the implant region 132 is arranged to partially span the thickness of the polysilicon layer 120. For example, non-implant regions without implant medium therein can be provided above and/or below the implant region 132. Other configurations of implant and non-implant regions are also useful. The non-implant regions can facilitate the formation of metal silicide therein.

In the embodiment of FIG. 2, the implant medium comprises He atoms. Other implant media or combinations are also useful. For example, hydrogen and/or argon atoms can be used. The implant medium should have a gaseous state at room temperature (e.g., about 20° C.) and a pressure of about 1 bar (100 kPa).

As shown in FIG. 2, a mask member 150 is provided between the structure 100 and a source of He atoms in spaced apart relationship with a surface 122 of the polysilicon layer 120. In some embodiments, the mask member 150 is provided in contact with the surface 122. In some embodiments the mask member 150 is formed directly on the surface 122.

In the embodiment of FIG. 2, the mask member has an opening arranged to allow exposure to incident He atoms of a portion of the polysilicon layer 120. The portion exposed is that located above STI region 108A separating each P-well 104 from an N-well 106.

In one embodiment, the implant conditions are established such that implantation of atoms occurs to a depth in the range of from around at least 30% to around 70% of the thickness of the polysilicon layer 120. In some embodiments, the range of depth is around half of the thickness of the polysilicon layer 120. Other implant depths may also be useful.

In the embodiment of FIG. 2, the mask member 150 is a mask used to define STI regions 108A of the structure. Other mask members are also useful such as masks used to define RX regions.

Figure 3:
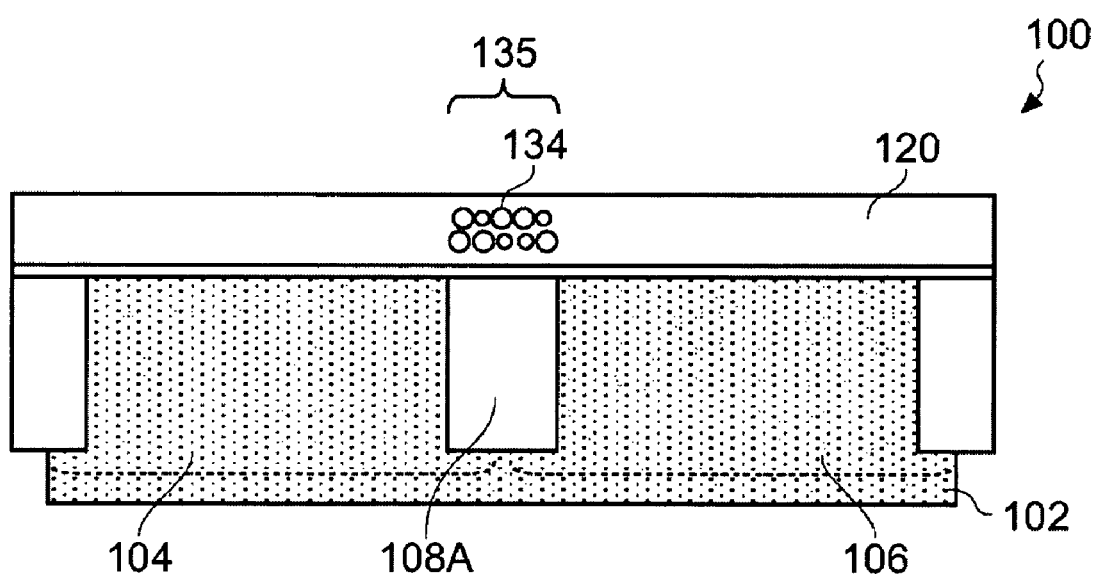

FIG. 3 shows the structure of FIG. 2 following an annealing process. The annealing causes implant medium to expand, forming cavities 134 in the implant region 132. The structure, for example, is annealed at a temperature of 800° C. for a period of from around 10 minutes to several hours. The annealing can be conducted in an inert gas atmosphere such as argon, nitrogen, or any other suitable inert gas. It will be appreciated that the size of the cavities formed by annealing of the structure will depend on the duration of the annealing process.

Other annealing temperatures are also useful. In some embodiments, annealing is performed at a temperature in the range of from around 800° C. to around 1000° C. In some embodiments, the annealing process is performed for a period of time sufficient to form cavities 134 in the polysilicon layer 120 having a size in the range of from around 2 nm to around 60 nm. In some embodiments, portions of the polysilicon layer 120 in which cavities 134 form provide a barrier 135 to diffusion of dopant atoms in the polysilicon layer 120 from one side of the barrier 135 to the other.

In the embodiment of FIG. 3, the layer of polysilicon is around 800 Å in thickness and the cavities have a size in the range of from around 5 nm to around 10 nm.

It is to be understood that if the cavities 134 are formed to be too large, the polysilicon line may fail. For example, the polysilicon line may disintegrate due to fracture of polysilicon.

It is also to be understood that the depth at which the cavities 134 may be formed is dependent on the depth of the structure to which the implant medium is implanted.

Figure 4:
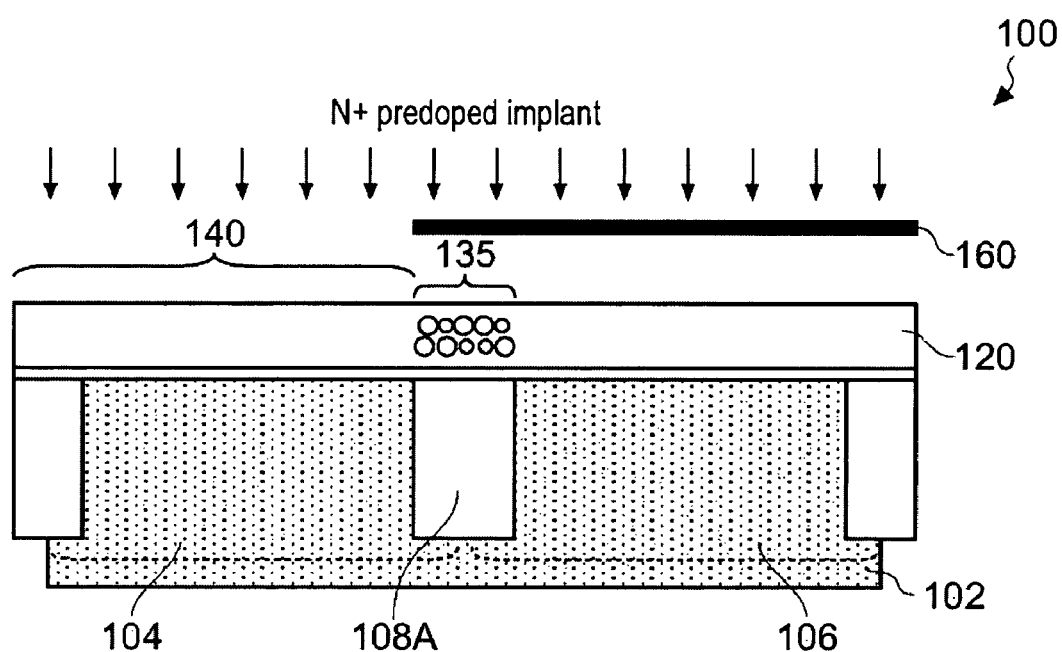

FIG. 4 shows the structure of FIG. 3 during a process of implanting dopants in a portion of the gate electrode layer 120. For example, n-type dopants are implanted into a portion of the polysilicon layer 120 overlying the P-well 104. A mask member 160 is provided between the polysilicon layer 120 and a source of n-type dopant thereby to shield the n-type dopant source from the portion of the polysilicon layer 120 overlying N-wells 104 and the portion of polysilicon layer 120 containing barrier 135. Implanting other types of dopants and/or in other portions of the gate electrode layer is also useful.

In the embodiment of FIG. 4, the n-type dopant comprises arsenic atoms. Other dopant atoms are also useful such as phosphorus atoms or any other suitable n-type dopant. The n-type dopant atoms are implanted to form an n+ predoped region 140.

The gate electrode and dielectric layers can be patterned to form gate conductors. In one embodiment, the gate electrode and dielectric layers are patterned to form a gate conductor passing through the N well and P well. Additional processes for completing transistors can be performed.

The embodiment of FIG. 4 has the feature that an amount of n-type dopant atoms that diffuse from the n+ predoped region 140 beyond the barrier region 135 is substantially reduced compared with a structure in which no barrier region 135 is provided.

Figure 5:
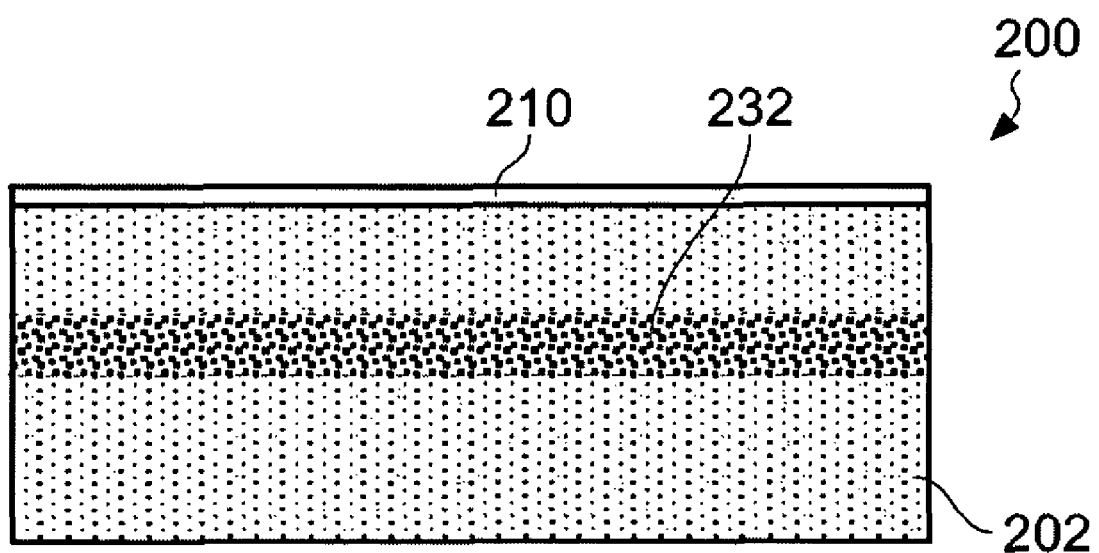
FIGS. 5 to 9 show structures formed during a process of forming a diffusion barrier in a substrate according to an embodiment of the invention.

FIG. 5 shows a structure 200 having a substrate 202 having a layer of a buffer medium 210 formed thereover. In the embodiment of FIG. 5, the buffer medium comprises nitrided silicon oxide. Other buffer media are also useful including silicon oxide and high-k gate dielectric materials.

In the structure of FIG. 5, an implant region 232 has been formed in the substrate 202 by implantation of an implant medium. The implant medium, for example, comprises He atoms. Other types of implant media, as described, are also useful. The implant region 232 is formed at a depth such that a MOSFET device may be formed above the implant region 232. The depth is also such that diffusion of dopant atoms away from the MOSFET device will be sufficiently limited by the implant region 232 to prevent substantial deterioration in device performance.

For structures formed using 45 nm feature size technologies, an implant energy in the range of from around 4 keV to around 7 keV is used, and a dose of from around $10^{14}$ to $5 \times 10^{15}$ cm$^{-2}$ is provided.

Figure 6:
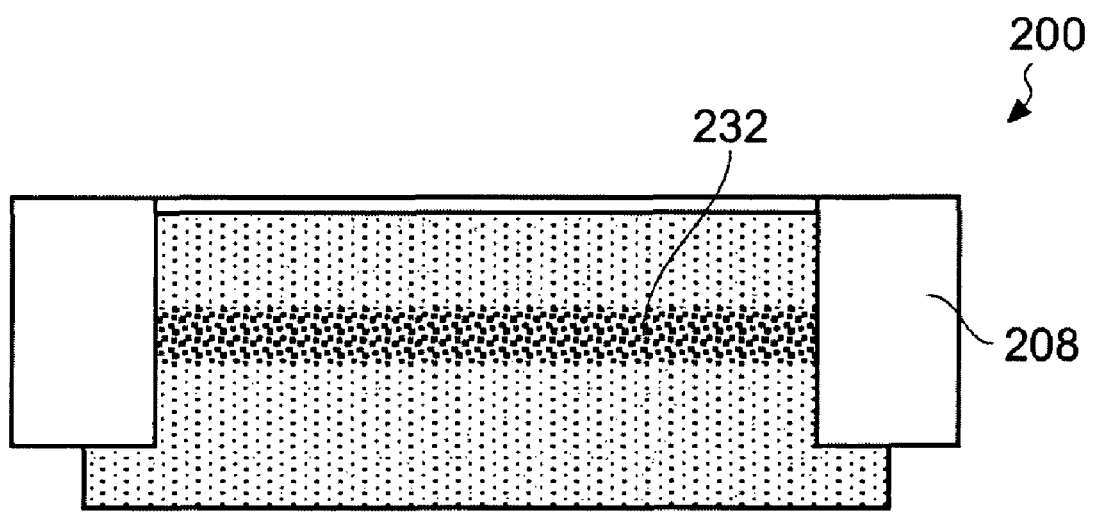

FIG. 6 shows the structure of FIG. 5 following a process of forming STI regions 208. The STI regions 208 are formed by a conventional fabrication process for STI formation.

Figure 7:
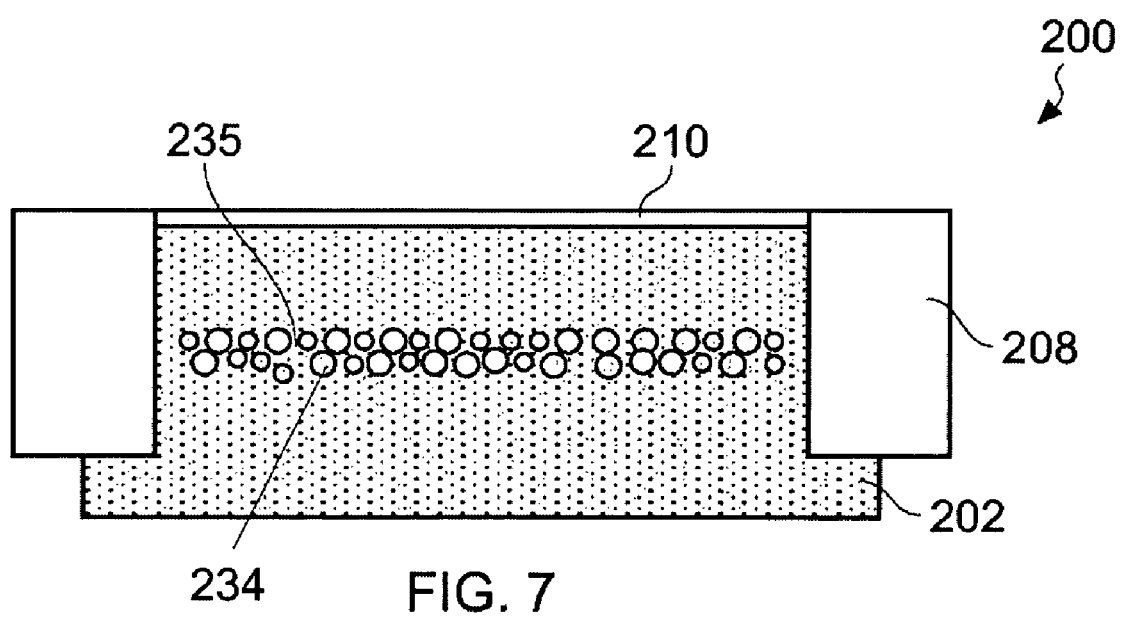

FIG. 7 shows the structure of FIG. 6 following a process of annealing the structure to form cavities 234 in the implant region 232 thereby to form a barrier region 235. In the embodiment of FIG. 7, the structure is annealed at a temperature of 800° C. for a period of between 10 minutes and several hours in an inert gas atmosphere. It is to be understood that in some embodiments the size of the cavities 234 formed upon annealing will depend upon the duration of the annealing process.

Figure 8:
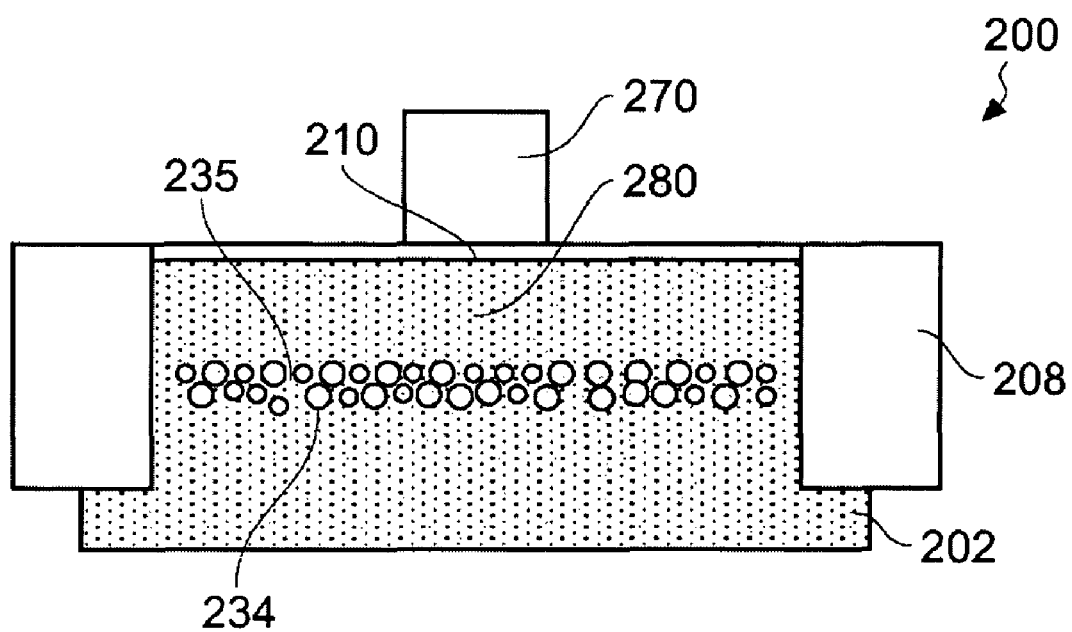

FIG. 8 shows the structure of FIG. 7 following a process of forming a gate dielectric layer 210 and subsequently a gate electrode 270 of a transistor, such as a MOSFET device, over the substrate 202. In the embodiment of FIG. 8, the gate dielectric layer 210 is formed from nitrided silicon oxide. Other gate dielectric media are useful including silicon oxide and high-k gate dielectric materials.

The gate electrode 270 is formed from polysilicon by a process of blanket layer formation followed by a process of patterning and etching.

Figure 9:
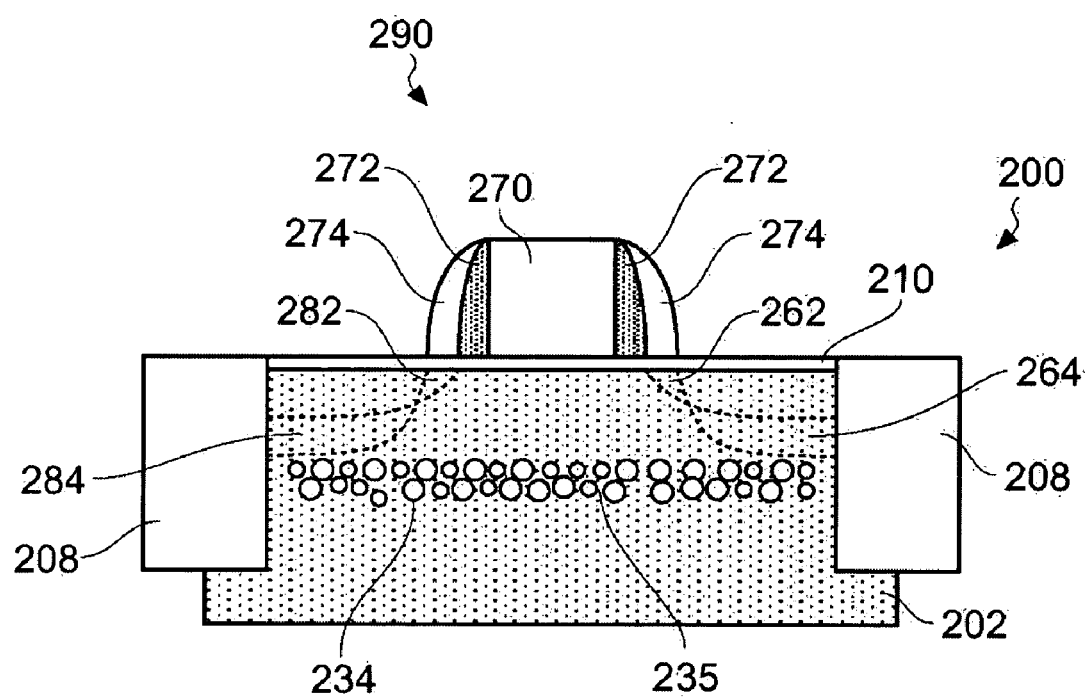

FIG. 9 shows the structure of FIG. 8 following a process of forming first spacer elements 272 on sidewalls of the gate electrode 270 followed by formation of source and drain halo regions 282, 262 respectively in the substrate 202 by implantation of dopant atoms.

Subsequently, second spacer elements 274 have been formed on the first spacer elements 272 and deep source and drain regions 284, 264 respectively formed by implantation of dopant atoms.

The structure of FIG. 9 provides a transistor 290, such as a MOSFET device located between STI regions 208. The structure has a barrier layer 235 formed from cavities 234 that span a distance from one STI region 208 to another adjacent STI region 208. This feature reduces an amount of diffusion of dopant atoms such as those dopant atoms forming the source and drain regions 284, 264 to portions of the substrate 202 away from the device 290. This results in a reduction in an extent to which device performance is degraded by diffusion of dopant atoms during a process of fabricating an integrated circuit comprising barrier layers according to some embodiments of the invention.

Figure 10:
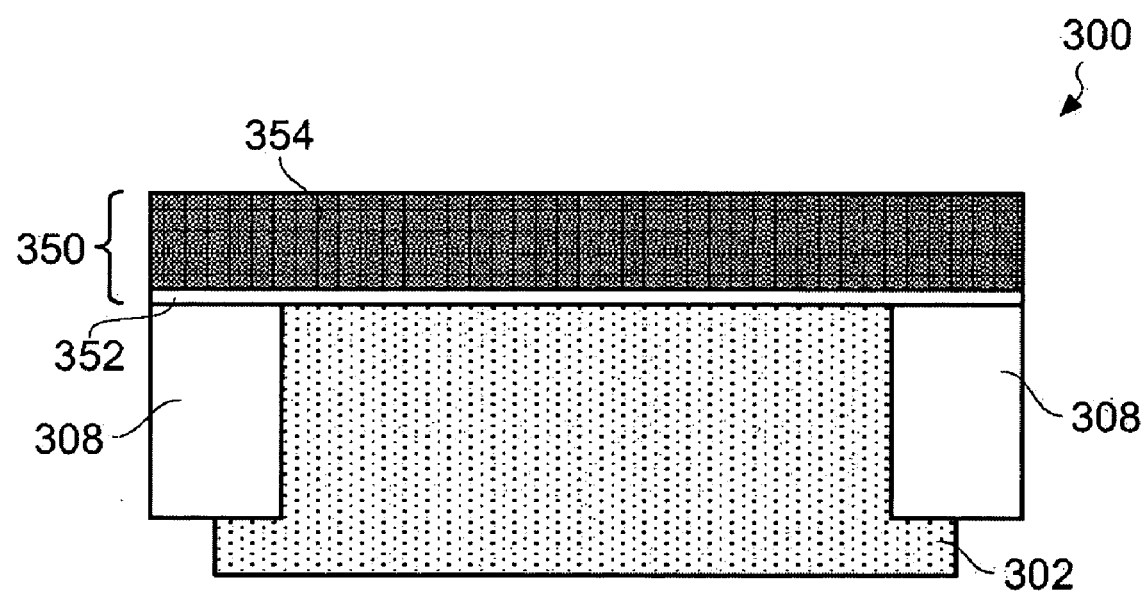
FIGS. 10 to 13 show structures formed during a process of forming a MOSFET device having a self-aligned diffusion barrier below a gate region of the device according to an embodiment of the invention.

FIG. 10 shows a structure 300 having a substrate 302 having STI regions 308 formed therein. A mask member 350, for example, having a layer of silicon oxide 352 and a layer of silicon nitride 354 thereover has been formed over the substrate 302. The layer of silicon oxide is formed to have a thickness of around 5-10 nm whilst the layer of silicon nitride is formed to have a thickness of around 20-80 nm. Other materials are useful for forming the mask member 350.

Other thicknesses of layers comprised by the mask member 350 are also useful. In some embodiments, the mask member is formed from a polymer-based photoresist material. Other photoresist materials are also useful.

Figure 11:
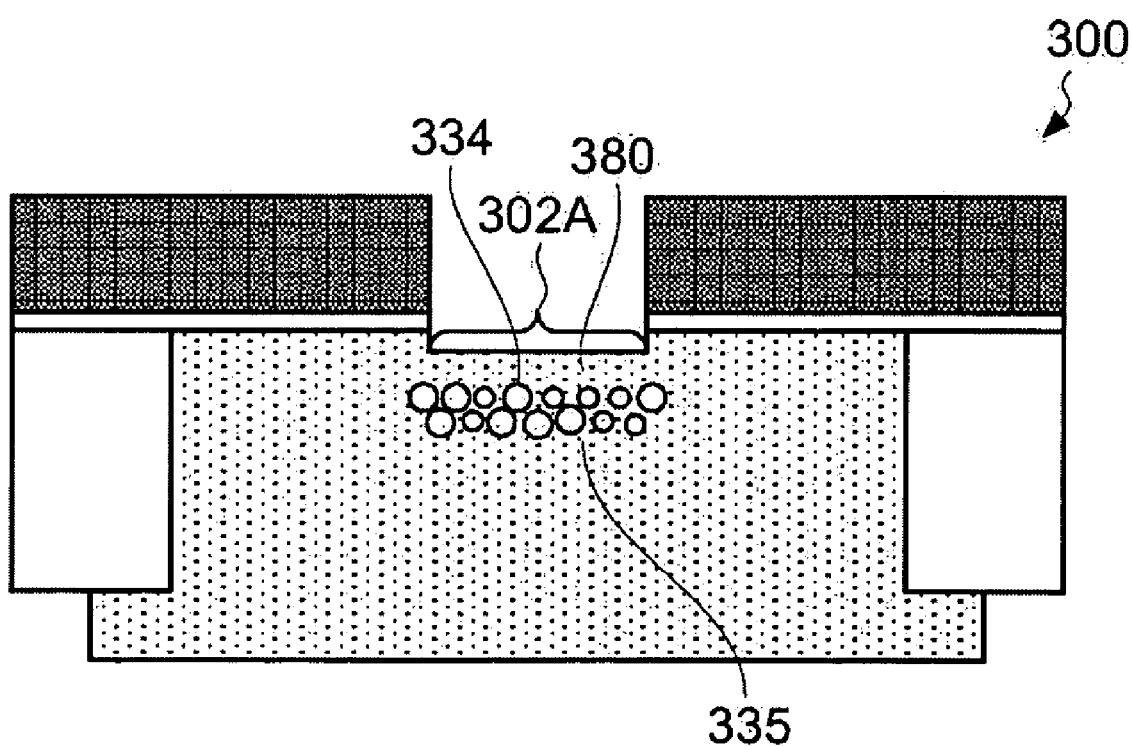

FIG. 11 shows the structure 300 of FIG. 10 following a process of etching the mask member 350 to expose a portion of the surface 302A of the substrate 302 over which a gate electrode is to be formed. Implantation of an implant medium into the substrate 302 has also been performed whereby an implant region is formed below a portion of the substrate that will form a channel region of the device. The implant region is provided between regions of the device in which source and drain implants, respectively, are to be made in order that the subsequently formed cavities will suppress lateral diffusion of implanted atoms.

In some embodiments, implantation of the implant medium is performed at an energy in the range of from around 2 keV to around 100 keV, and at a dose of around $1 \times 10^{13}$ to around $5 \times 10^{15}$ cm$^{-2}$.

Following implantation, the structure 300 is annealed at a temperature of 800° C. to form cavities 334 in the substrate 302 in a similar manner to that described above with respect to other embodiments of the invention. Other temperatures are also useful, as discussed in respect of other embodiments of the invention.

The structure is configured whereby the cavities provide a diffusion barrier 335 in a region of the substrate immediately below a channel region 380 of the structure.

Figure 12:
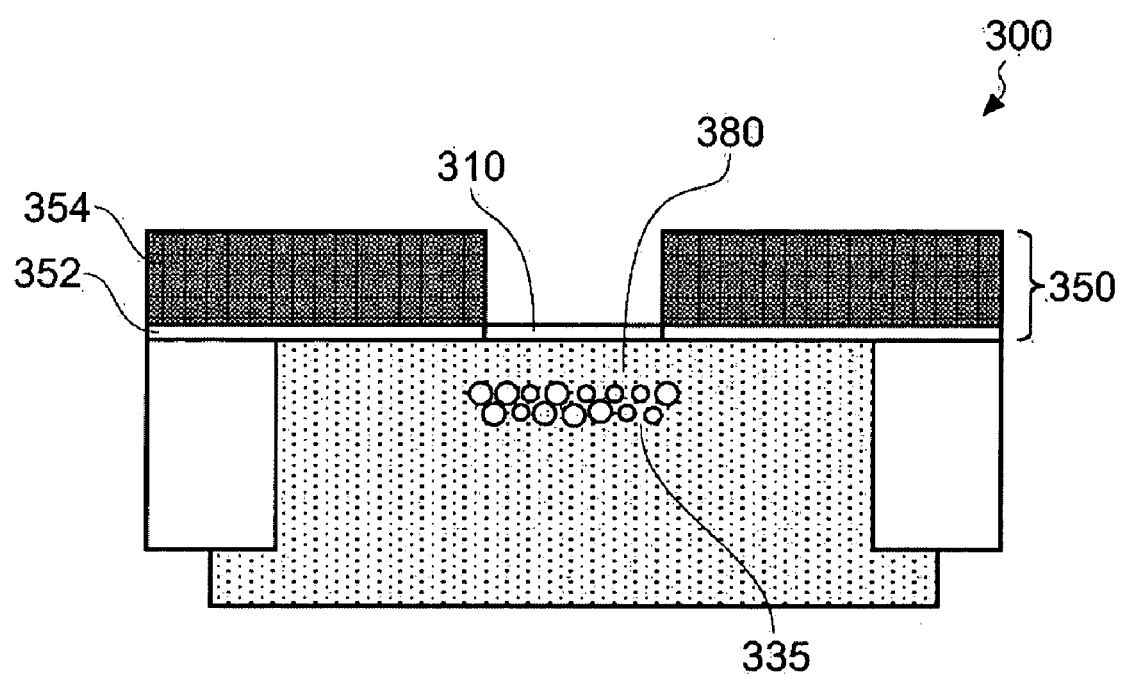

FIG. 12 shows the structure 300 of FIG. 11 following a process of forming a gate dielectric layer 310 over the exposed portion 302A of the surface of the substrate 302. In the embodiment of FIG. 12, the gate dielectric is a layer of silicon oxide. Other gate dielectric materials are useful in addition to or instead of silicon oxide. For example, a high-k gate dielectric material such as hafnium oxide or any other suitable material may be used.

Figure 13:
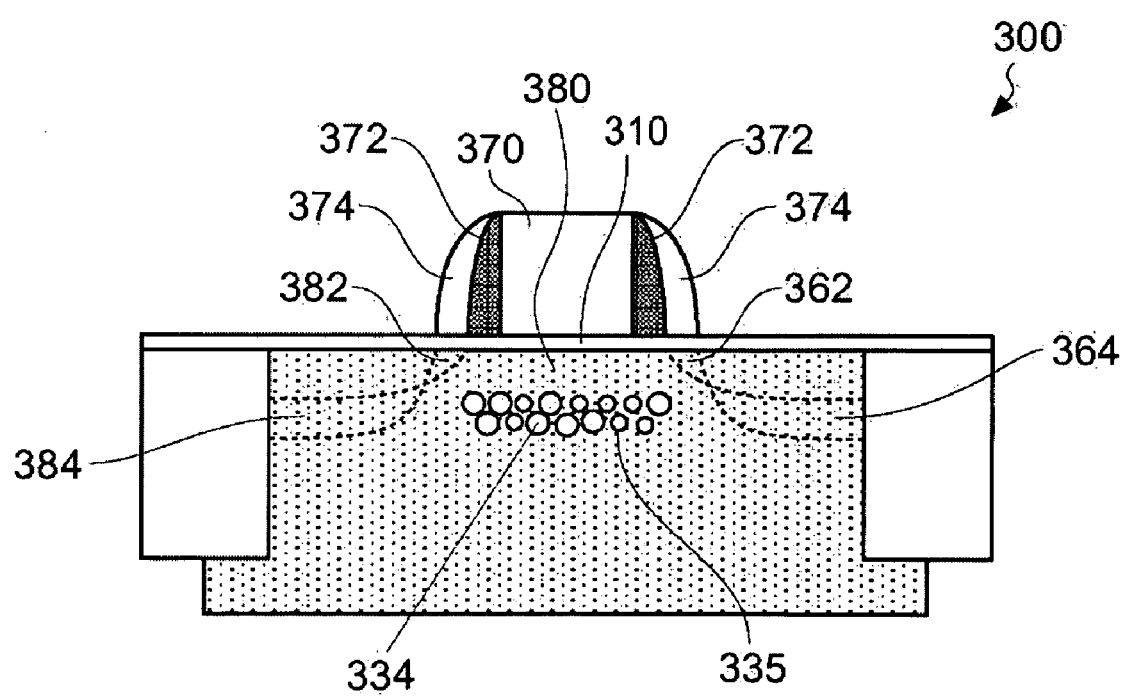

In a subsequent step, a blanket layer of polysilicon 370 as shown in FIG. 13 is formed over the structure and an etchback process performed to define a gate electrode 370 above the gate dielectric layer 310.

FIG. 13 shows the structure of FIG. 12 following a process of removal of the nitride layer 354 and formation of first spacer elements 372 on sidewalls of the gate electrode 370. Source and drain halo regions 382, 362 are formed by implantation of dopant atoms. Second spacer elements 374 are formed on the first spacer elements 372 and deep source and drain regions 384, 364 formed by implantation of dopant atoms.

The resulting structure 300 of FIG. 13 provides a MOSFET device having a self-aligned diffusion barrier 335 below the channel region 380 of the structure that is provided by the presence of cavities 334 in the substrate. The cavities 334 may also be referred to as 'microcavities' 334. As can be seen from FIG. 13, the diffusion barrier 335 has been formed below the channel region 380 at a depth corresponding to that of lower portions of the deep source and drain regions 384, 364.

Figure 14:
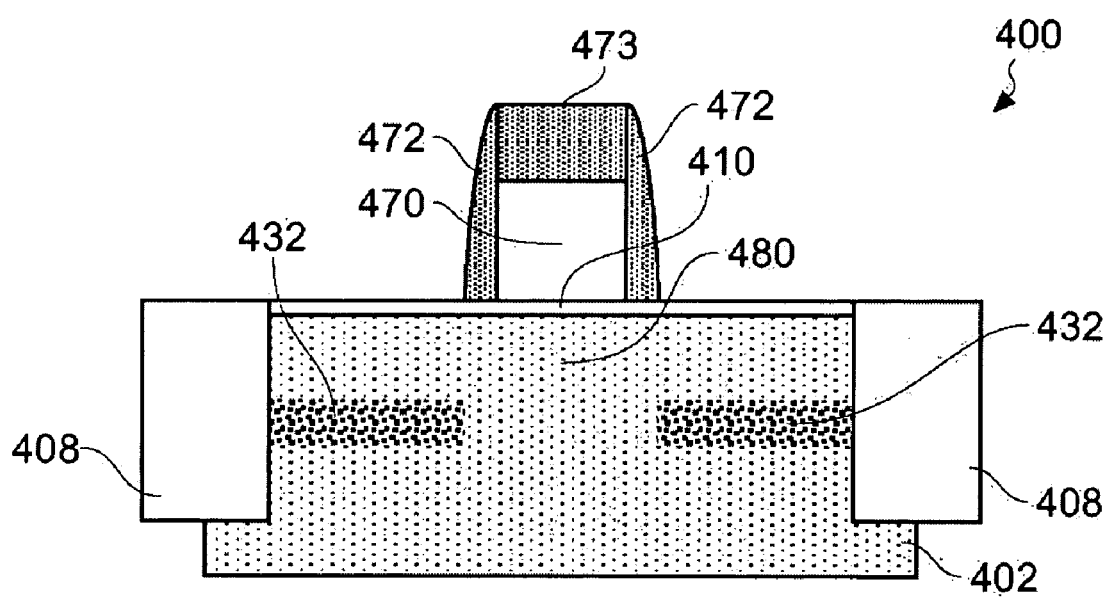
FIGS. 14 to 16 show structures formed during a process of forming a MOSFET device having self-aligned diffusion barriers below source and drain regions of the device according to an embodiment of the invention.

FIG. 14 shows a structure 400 having a substrate 402 having STI regions 408 formed therein and a layer of a gate dielectric material 410 formed thereover. In the embodiment of FIG. 14, the gate dielectric material is silicon oxide. Other gate dielectric materials are also useful, as discussed above with respect to other embodiments of the invention.

A gate electrode 470 has been formed over a channel region 480 of the structure. In the embodiment of FIG. 14, the gate electrode 470 is formed from polysilicon. Other materials are also useful. First spacer elements 472 have been formed on sidewalls of the gate electrode 470 and a capping layer 473 provided over the gate electrode 470. In the embodiment of FIG. 14, the first spacer elements 472 and capping layer 473 are formed from silicon nitride. Other materials are also useful.

Implant regions 432 have been formed in the substrate 402 below source and drain regions of the structure by implantation of an implant medium as described above with respect to other embodiments. The capping layer 473 and first spacer elements 472 mask the channel region 480 of the substrate 402 from the implant medium in a similar manner to the mask member 350 of the embodiment of FIG. 10.

Figure 15:
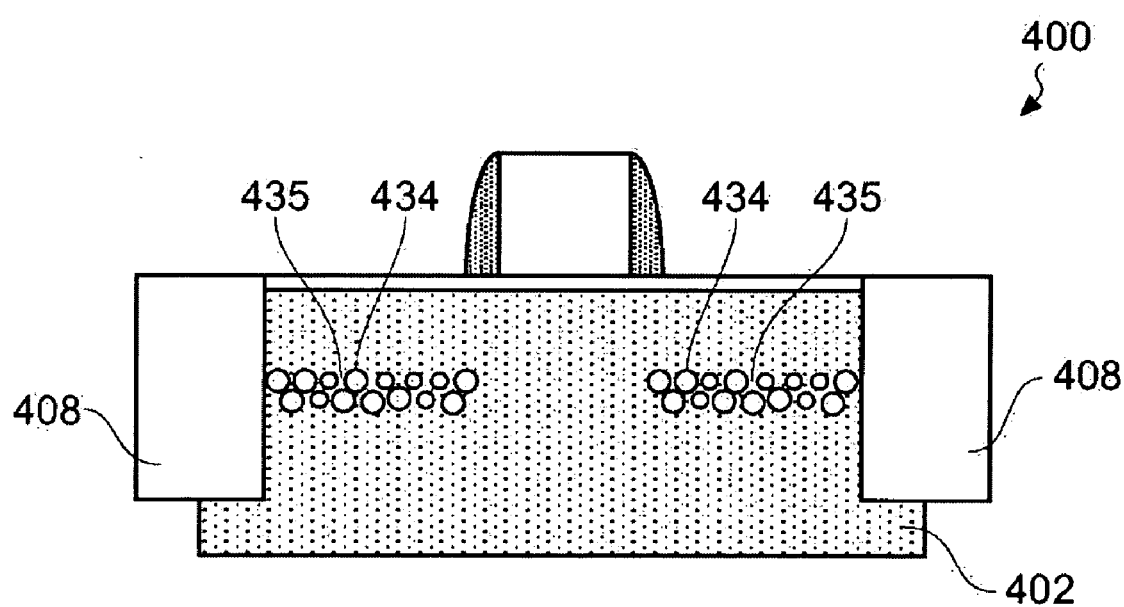

FIG. 15 shows the structure 400 of FIG. 14 following a process of annealing the structure 400 to form barrier regions 435 each comprising a plurality of cavities 434. Implant conditions are optimised such that the barrier regions 435 are formed below regions of the substrate where respective source and drain regions are to be formed.

It will be appreciated that implantation of source and drain dopant atoms may be performed before or after formation of the barrier regions 435. In the embodiment of FIG. 15, the source and drain dopant atoms are implanted after formation of the barrier regions 435.

In the embodiment of FIG. 15, the implant energy is in the range of from around 2 keV to around 100 keV depending upon the depth to which the source and drain regions are to be formed, at a dose of around $1 \times 10^{13}$ to around $5 \times 10^{15}$ cm$^{-2}$.

Figure 16:
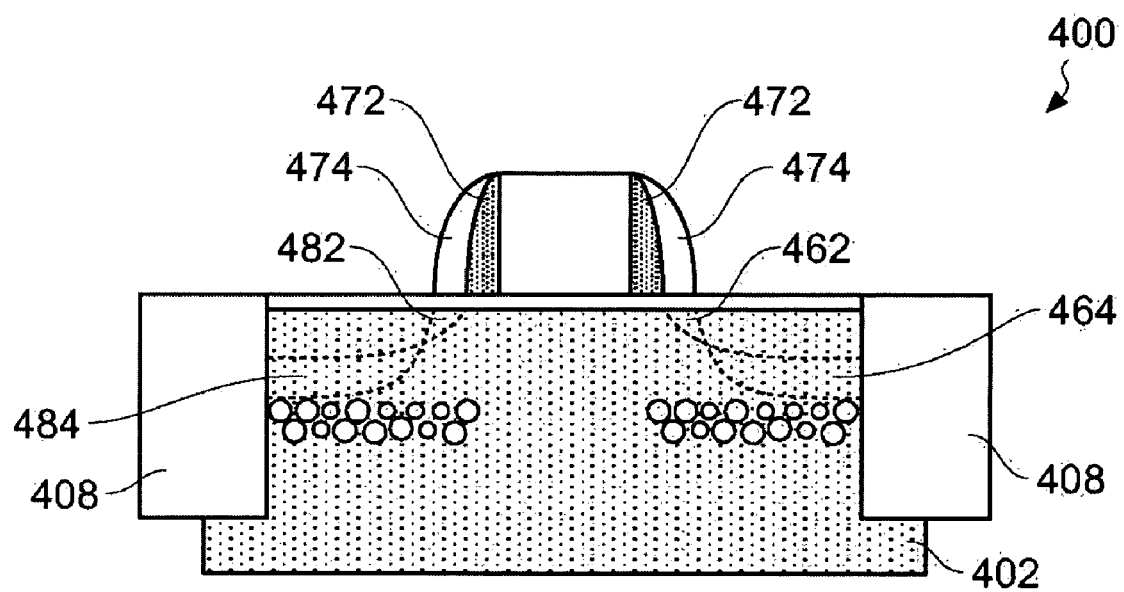

FIG. 16 shows the structure 400 of FIG. 15 following a process of implanting a dopant medium to form source and drain halo regions 482, 462 followed by formation of second spacer elements 474 over the first spacer elements 472. Implantation of a dopant medium is then performed to form deep source and drain regions 484, 464.

In embodiments of the invention in which FET devices are formed, the dopant medium used to form source and drain halo regions and deep source and drain regions may be an n-type dopant medium in the case of the formation of an NFET device or a p-type dopant medium in the case of formation of a PFET device.

It is understood that various embodiments of diffusion barriers can be combined, such as any two or more embodiments. For example, a diffusion barrier below the channel (as shown in FIG. 13) can be combined with diffusion barriers below the source/drain regions (as shown in FIG. 15) or the diffusion barrier below the channel can be combined with the diffusion barrier in the substrate below the transistor (as shown in FIG. 9). Furthermore, these embodiments can be combined with the barrier in a portion of the gate electrode (as shown in FIG. 3). The implantation can be performed by separate processes while the annealing can be combined. Other process sequences or combinations are also useful.

Some embodiments of the invention have the advantage that electrical properties of transistor devices of an integrated circuit structure are improved relative to integrated circuit structures not having diffusion barriers according to one or more embodiments of the invention. This is at least in part because in some embodiments of the invention an amount of diffusion of dopant atoms from one region of a device structure to another region is substantially reduced.

Throughout the description and claims of this specification, the words "comprise" and "contain" and variations of the words, for example "comprising" and "comprises", means "including but not limited to", and is not intended to (and does not) exclude other moieties, additives, components, integers or steps.

Throughout the description and claims of this specification, the singular encompasses the plural unless the context otherwise requires. In particular, where the indefinite article is used, the specification is to be understood as contemplating plurality as well as singularity, unless the context requires otherwise.

Features, integers and characteristics described in conjunction with a particular aspect, embodiment or example of the invention are to be understood to be applicable to any other aspect, embodiment or example described herein unless incompatible therewith.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a device comprising:
    providing a structure having first and second regions, wherein providing the structure comprises forming a gate electrode layer on a substrate;
    forming a diffusion barrier between at least a portion of the first and second regions, wherein the diffusion barrier comprises cavities which reduce diffusion of elements between the first and second regions, and the diffusion barrier is formed in the gate electrode layer.

2. The method of claim 1 wherein forming the diffusion barrier comprises:
    providing a mask on top of the structure, the mask shields at least the portion of the first and second regions;
    implanting dopants in regions not covered by the mask to form an implant region; and
    annealing the implant region to form the cavities.

3. The method of claim 2 wherein providing the mask comprises forming the mask directly on the structure.

4. A method of forming a device comprising:
    providing a structure having first and second regions, wherein the structure comprises a gate electrode layer on a substrate; and
    forming a diffusion barrier in the gate electrode layer between at least first and second regions of the gate electrode layer, wherein the diffusion barrier comprises cavities which reduce diffusion of elements between the first and second regions.

5. The method of claim 4 wherein forming the diffusion barrier comprises:
    providing a mask on top of the structure, the mask shields at least the portion of the first and second regions;
    implanting dopants in regions not covered by the mask to form an implant region; and
    annealing the implant region to form the cavities.

6. The method of claim 5 wherein providing the mask comprises forming the mask directly on the structure.

7. The method of claim 4 wherein the first and second regions of the gate electrode layer is disposed along a length of the gate electrode layer.

* * * * *